United States Patent [19]

Little et al.

[11] Patent Number: 4,470,856
[45] Date of Patent: Sep. 11, 1984

[54] SELF-COMPENSATING HYDROSTATIC FLATTENING OF SEMICONDUCTOR SUBSTRATES

[75] Inventors: Michael J. Little, Tarzana; Roger H. Brown, Burbank; Uzi Efron, Los Angeles; Clarence P. Hoberg, Pacific Palisades, all of Calif.

[73] Assignee: Hughes Aircraft Company, El Segundo, Calif.

[21] Appl. No.: 464,442

[22] Filed: Feb. 7, 1983

[51] Int. Cl.³ .............................................. G01B 11/06
[52] U.S. Cl. .................................... 156/64; 29/576 R; 73/432 L; 156/378
[58] Field of Search ...................... 29/571, 584, 576 R, 29/576 S; 73/432 L; 156/64, 378

[56] References Cited

U.S. PATENT DOCUMENTS

| | | | |
|---|---|---|---|
| 3,229,224 | 1/1966 | Waly et al. | 73/432 L |
| 3,510,374 | 5/1970 | Walker | 156/64 |
| 3,573,455 | 4/1971 | Suierveld | 156/64 X |
| 3,802,065 | 4/1974 | Vosburgh | 29/574 |
| 3,843,401 | 10/1974 | Carroll | 73/432 L X |
| 4,156,963 | 6/1979 | Tsuji et al. | 29/581 |

OTHER PUBLICATIONS

Efron et al., "A Silicon Photoconductor Based Liquid Crystal Light Valve", Society for Information Display Technical Digest, vol. 12, 1981, p. 142.

Primary Examiner—Robert Dawson
Attorney, Agent, or Firm—G. B. Rosenberg; D. W. Collins; A. W. Karambelas

[57] ABSTRACT

A semiconductive substrate, such as a silicon wafer, is mounted on a baseplate for inclusion in an optical device such as a liquid crystal light valve. An optical flat presses the top surface of silicon wafer toward the baseplate and against an O-ring seal surrounding a fluid adhesive. The fluid adhesive hydrostatically distributes the force of compression to guarantee optical flatness and self-compensation for the amount fluid adhesive surrounded by the O-ring. The optical flatness of the semiconductor substrate is limited only by the flatness of the optical flat against which it is compressed. Parallel alignment of the optical flat, the substrate and the baseplate is achieved by reflecting a laser beam through the semiconductive substrate and observing the interference fringes therein, while adjusting the relative alignment so as to maximize the distance between fringes.

5 Claims, 6 Drawing Figures

SELF-COMPENSATING HYDROSTATIC FLATTENING OF SEMICONDUCTOR SUBSTRATES

BACKGROUND OF THE INVENTION

Semiconductor material such as silicon is used in either wafer or chip form in several types of optical devices. Some examples are the well-known infrared detector focal plane array formed on a silicon chip and another is a silicon liquid crystal light valve which uses a silicon wafer, and is of the type described in U. Efron et al, "A Silicon Photoconductor Based Liquid Crystal Light Valve", *Society for Information Display Technical Digest*, Vol. 12, 1981, page 142. The silicon chip used in the infrared detector focal plane array and the silicon wafer used in the liquid crystal light valve must have a flat finish of optical quality. To this end, particularly in the liquid crystal light valve, the silicon may be polished using mechanical-chemical techniques to achieve the optical quality flatness.

The substrate for the silicon based liquid crystal light valve described in the above-referenced Efron publication is a very thin silicon wafer, about 5 mils thick and about 2 inches in diameter, that is chemically and mechanically polished on both sides. Because the wafer is very thin and therefore somewhat flexible and because of the limitations of chemical-mechanical polishing, such silicon wafers do not have the ideal flatness preferred in liquid crystal light valves. Specifically, peak-to-valley deviations from flatness are typically on the order of 5 microns on each side. Because the flatness deviations on one side are independent on those on the other side of the wafer, the thickness variations may be as much as 10 microns.

For ideal optical performance of a liquid crystal light valve, the surface of the wafer should preferably be flat to within 1 micron.

SUMMARY OF THE INVENTION

In the present invention, a silicon wafer or silicon chip is flattened by compressing it between two surfaces, one of which is optically flat and the other of which the chip or wafer is to be fastened to. The force of compression is hydrostatically distributed through a fluid medium disposed between the wafer or chip and the other surface. The fluid medium thereafter solidifies as an adhesive between the chip or wafer and the other surface to which it is to be mounted. The hydrostatic distribution is achieved by sealing the fluid adhesive between the wafer or substrate and the mounting surface by means of a flexible O-ring which expands to permit compensation for the amount of fluid adhesive contained within the volume defined by the O-ring, the optical flat surface and the wafer or chip. Nearly perfect parallel alignment between the optical flat surface and the wafer surface pressed against it is achieved by a laser alignment technique in which a laser beam is directed through an aperture in the optical flat surface so that it is reflected from the facing surface of the silicon wafer or chip and thereafter passes through a beam splitter onto an image plane. The alignment between the optical flat and the wafer surface is adjusted to maximize the spacing between interference fringes observed in the image plane. This adjustment causes them to come into nearly perfect parallel alignment with one another. This, therefore, forces the surface of the wafer or chip facing the optically flat surface to deform to a perfectly flat configuration, which is the desired result. Thereafter, the adhesive hardens against the opposite wafer surface and maintains the flat parallel configuration permanently.

A silicon wafer is mounted on a bottom optical flat using an adhesive in accordance with the present invention as follows: first, a flexible O-ring is placed on the bottom mounting surface. The space on the optical flat surrounded by the O-ring is then filled with a fluid adhesive. Thereafter, the wafer is placed on the O-ring over the fluid adhesive. Finally, a the optical flat surface is pressed directly onto the top of the wafer so as to compress the O-ring and adhesive.

DESCRIPTION OF THE DRAWINGS

The invention is best understood by reference to the accompanying drawings in which.

DETAILED DESCRIPTION OF THE INVENTION

Figure 1:
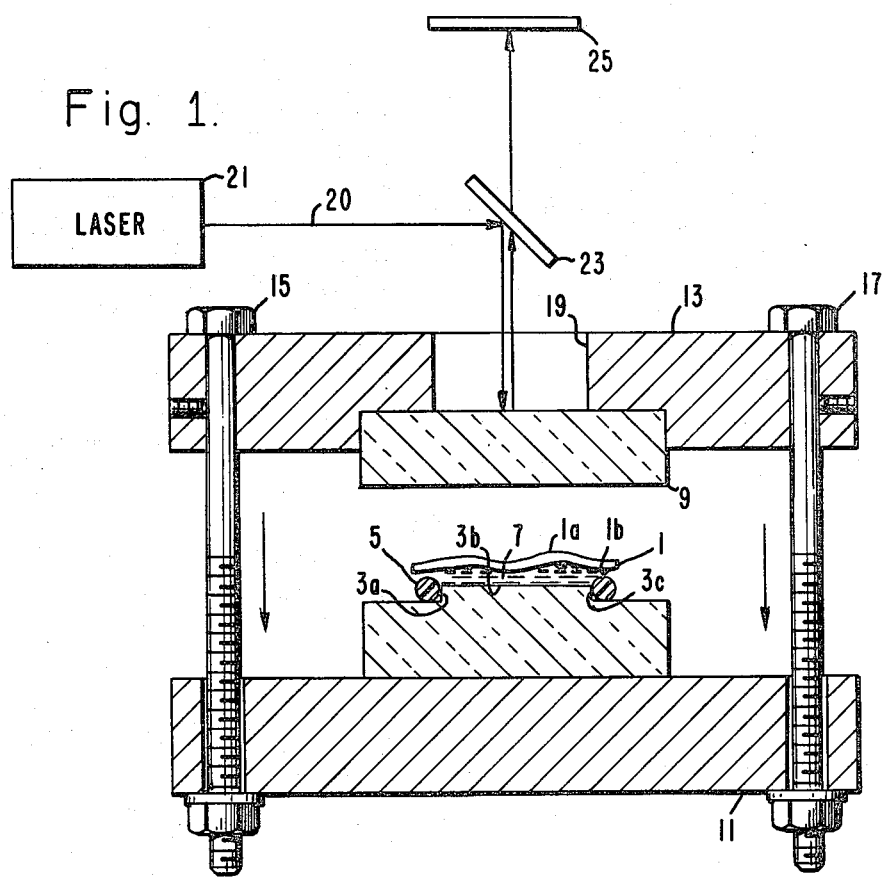
FIG. 1 is a simplified cross-sectional view and partial diagram illustrating the basic method of the present invention.

Referring to FIG. 1, a semiconductor substrate 1, which may be, for example, a silicon wafer or a silicon chip, is to be mounted to a base plate 3 in the course of fabricating an optical device, such as, for example, a silicon based liquid crystal light valve. The problem is that the substrate 1 is not perfectly flat and may have flatness deviations on the order of 5 microns on both its top surface 1a and its bottom surface 1b. The base plate 3 to which the substrate 1 is to be mounted includes a raised plateau 3a having a top surface 3b.

If only the top surface 1a of the wafer 1 is to be flattened, it is not necessary that the top surface 3b of the plateau 3a be optically flat. However, if the wafer 1 is to be used as a photo substrate in a photoactivated liquid crystal light valve, then the space between the wafer surface 1b and the plateau surface 3b should be minimized. In this particular instance, the plateau surface 3b preferably is of an optically flat quality, having flatness deviations therein on the order of only 1 micron or less.

A flexible O-ring 5 is stretched around the plateau 3a so that a perfect seal is achieved therebetween. The O-ring has a diameter which is somewhat greater than the height of the plateau 3b so that a fluid adhesive 7 poured on top of the plateau 3b is held thereover by the O-ring 5. It is after the O-ring has been stretched around the plateau 3b and the adhesive poured over the plateau that the substrate 1 is placed over the O-ring 5. A top optical flat 9 is then pressed down over the substrate 1. Pressing is achieved by means of a base plate 11 and a top plate 13 mounted together by means of two screws 15 and 17 and two other screws, not visible in the cross-sectional view of FIG. 1, which are all tightened together in unison to maintain a parallel alignment between the baseplate 3 and top optical flat 9. The hydrostatic pressure thus generated throughout the fluid adhesive 7 forces virtually the entire surface of the top wafer surface 1a to contact and press uniformly against the bottom surface of the optical flat 9.

Figure 6:
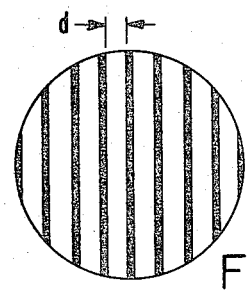
FIG. 6 is an exemplary plan view through the image plane of FIG. 1 illustrating interference fringes observed through the aperture of FIG. 1.

Adjustment of the screws 15, 17 is made in accordance with a laser alignment method made possible by the presence of an aperture 19 in the top plate 13. Specifically, a laser beam 20 from a laser 21 is reflected by a beamsplitter 23 through the aperture 19 and through the top optical flat 9 (which is made of high quality glass for this purpose) so that the beam reflects from both the top surface 1a of the semiconductor substrate 1 and from the bottom surface of the optical flat 9. The reflected beams thereafter pass through the beamsplitter 23 and form interference fringes observed on an image plane 25. Misalignment between the optically flat bottom surface of the optical flat 9 and the top surface 1a of the wafer 1 is indicated by interference fringes of the type illustrated in FIG. 6. The screws 15 and 17 are adjusted while pressing the top optical flat 9 against the substrate 1 so as to maximize the straightness of the fringes of FIG. 6, which guarantees flatness of the ;wafer surface 1a. In some cases, it may be desirable to further adjust the screws 15 and 17 so as to maximize the distance D between the dark interference fringes illustrated in FIG. 6. This latter adjustment guarantees parallel alignment between the bottom surface of the optical flat 9 and the top wafer surface 1a to within less than a wavelength of the laser 21. Observation of the image plane 25 may be made by means of a screen, a camera or a photodetection system.

As the screws 15, 17 are turned to tighten the top optical flat 9 against the substrate 1, the force of compression created thereby presses the substrate 1 closer to the top surface 3b of the baseplate 3 causing the fluid adhesive 7 to spread itself so as to fill all voids in the space defined by the O-ring 5, this compression causing the O-ring 5 to expand radially outward to accommodate the displacement of the adhesive 7. The amount of fluid adhesive 7 present in the space defined by the O-ring 5 is not critical because the radial expansion of the O-ring 5 compensates for any amount of adhesive 7 originally present in the space defined by the O-ring 5. If the wafer 1 is to be used as the photo-substrate of photo activated liquid crystal light valve, it is desirable to minimize the distance between the bottom wafer surface 1b and the top mounting surface 3b. In this case, the O-ring should be sufficiently flexible to permit optimum displacement of the adhesive.

In the presently preferred embodiment of the invention, the O-ring is made of a commercially available substance, Viton, while the adhesive 7 is an epoxy known as Epon 828. The optical flat 9 comprises a well known high quality commercially available glass known as B-K7.

Figure 2:
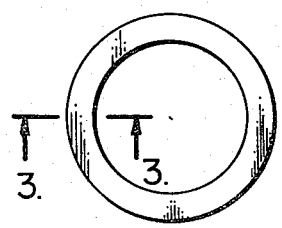
FIG. 2 is a plan view of the O-ring employed in the method illustrated in FIG. 1.
Figure 3:
FIG. 3 is a cross-sectional view corresponding to view 3—3 of FIG. 2.

FIG. 2 is a top plan view of the O-ring 5 and FIG. 3 is a cross-sectional view of the preferred cross-sectional configuration of the O-ring 5 corresponding to view 3—3 of FIG. 2.

Figure 4:
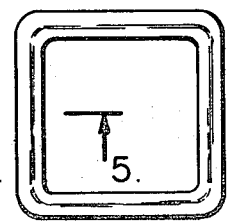
FIG. 4 is a plan view of an exemplary square shaped flexible ring to be used in place of the O-ring of FIG. 2 for a square shaped semiconductor substrate.
Figure 5:
FIG. 5 is a cross-sectional view corresponding to view 5—5 of FIG. 4.

As previously mentioned, the method of this invention is useful not only with a circular silicon wafer but is also useful to flatten silicon chips, which are generally of a square or rectangular configuration. FIG. 4 illustrates the plane view of an O-ring 5 which conforms to the shape of a square or a rectangular silicon chip. The cross-sectional configuration of the "square" O-ring of FIG. 4 may assume either the preferred geometry illustrated in FIG. 3 or the alternative geometry illustrated in FIG. 5 corresponding to view 5—5 of FIG. 4.

In certain applications, the distance between the bottom surface 1b of the substrate 1 and the top surface 3b of the baseplate 3 may be critical. In such a case, it is simply required to compress the substrate 1 against the top surface 3b until this critical distance is achieved, because the O-ring 5 will deform to compensate for any amount of compression.

It is understood, of course, that once the desired compression of the substrate 1 between the optical flat 9 and the baseplate 3 has been achieved, that the apparatus illustrated in FIG. 1 is left in place until the adhesive 7 has completely solidified. Thereafter, the screws 15 and 17 are backed off and the baseplate 3 and substrate 1 are removed as a single unit. After the method of this invention has been performed as described above, the flatness of the top surface 1a of the semiconductive substrate is limited only by the flatness of the top optical flat 9, which is a significant improvement over the flatness achieved in prior art mechanical-chemical polishing techniques.

What is claimed is:

1. A method for mounting one surface of a semiconductor member on a baseplate and flattening the other surface of said semiconductor member to an optically flat finish, comprising:
   placing a flexible ring seal on the top surface of said baseplate;
   placing a fluid adhesive on said top surface of said baseplate so that it is surrounded by said flexible ring seal;
   placing said semiconductor substrate over said flexible ring seal;
   pressing an optically flat surface over said semiconductive substrate so as to compress and displace said ring seal and said fluid adhesive; and
   holding said optically flat surface in place after said pressing step until said adhesive has solidified.

2. The method of claim 1 wherein said optically flat surface has an aperture, said method further comprising:
   directing a laser beam through said aperture so that said beam reflects from the top and bottom surfaces of said semiconductive substrate;
   observing interference fringes from the reflected beam at an image plane; and
   adjusting the relative alignment between said baseplate and said optically flat surface so as to maximize first the straightness of the interference fringes and second the distance between said interference fringes observed at said image plane.

3. An apparatus for mounting and flattening a semiconductive substrate which may be either a wafer or a chip, on the top surface of a baseplate, comprising:
   a flexible ring seal disposed on said baseplate top surface;
   a fluid adhesive surrounded by said ring seal;
   a semiconductive substrate disposed over said ring seal and said fluid adhesive;
   a top plate having an optically flat bottom surface;
   means for pressing said top plate and said bottom baseplate together toward another, including means for adjusting the relative parallel alignment between said top optical flat and said bottom base plate.

4. The apparatus of claim 3 further comprising means for reflecting a coherent beam from said bottom and top surfaces of said semiconductive substrate and permitting observation of interference fringes therefrom.

5. The apparatus of claim 3 wherein said baseplate top surface is optically flat.

* * * * *